United States Patent
Cranford, Jr. et al.

(10) Patent No.: US 10,447,389 B2
(45) Date of Patent: Oct. 15, 2019

(54) MANAGING DATA FLOW IN VCSEL-BASED OPTICAL COMMUNICATIONS SYSTEM

(71) Applicants: GLOBALFOUNDRIES Inc., Grand Cayman (KY); International Business Machines Corporation, Armonk, NY (US)

(72) Inventors: Hayden C. Cranford, Jr., Cary, NC (US); Jonathan E. Proesel, Mount Vernon, NY (US); Rashmi R. Bindu, Raleigh, NC (US)

(73) Assignees: GLOBALFOUNDRIES INC., Grand Cayman (KY); International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/686,304

(22) Filed: Aug. 25, 2017

(65) Prior Publication Data

US 2019/0068278 A1  Feb. 28, 2019

(51) Int. Cl.
  *H04B 10/079* (2013.01)
  *H04B 10/50* (2013.01)
  *H01S 5/068* (2006.01)

(52) U.S. Cl.
  CPC ... *H04B 10/07955* (2013.01); *H01S 5/06804* (2013.01); *H04B 10/503* (2013.01)

(58) Field of Classification Search
  CPC combination set(s) only.
  See application file for complete search history.

(56) References Cited

U.S. PATENT DOCUMENTS

| | | | |
|---|---|---|---|
| 5,285,466 A | 2/1994 | Tabatabaie | |
| 6,016,326 A | 1/2000 | Claisse et al. | |
| 8,971,362 B2 | 3/2015 | Smith et al. | |
| 2004/0022544 A1 | 2/2004 | Case et al. | |
| 2004/0228377 A1* | 11/2004 | Deng | H01S 5/02453 372/34 |
| 2009/0310867 A1 | 12/2009 | Matei et al. | |
| 2010/0150567 A1 | 6/2010 | Kondo et al. | |
| 2013/0266326 A1* | 10/2013 | Joseph | H01S 5/183 398/130 |

(Continued)

OTHER PUBLICATIONS

U.S. Appl. No. 15/982,459, Office Action dated Sep. 7, 2018, 11 pages.

(Continued)

*Primary Examiner* — Omar S Ismail
(74) *Attorney, Agent, or Firm* — David Cain; Hoffman Warnick LLC

(57) ABSTRACT

Methods according to the disclosure include methods for managing data flow in an optical communications system having a plurality of vertical cavity surface emitting lasers (VCSELs). The method generally includes determining whether operation of the system exceeds a thermal threshold for a thermal parameter of the system, and switching from a first data bandwidth to a second data bandwidth when the thermal threshold is exceeded. Operation at the second data bandwidth further includes determining whether further operation of the system demands the first data bandwidth, and resuming operation of the system at the first data bandwidth only when the thermal parameter during operation at the second data bandwidth does not exceed the thermal threshold.

17 Claims, 5 Drawing Sheets

(56) References Cited

U.S. PATENT DOCUMENTS

2015/0318666 A1* 11/2015 Hammar ................ B82Y 20/00
  372/45.01
2015/0340841 A1* 11/2015 Joseph ................ H01S 5/18388
  372/50.12

OTHER PUBLICATIONS

U.S. Appl. No. 15/982, Notice of Allowance dated Dec. 14, 2018, 5 pages.

* cited by examiner

MANAGING DATA FLOW IN VCSEL-BASED OPTICAL COMMUNICATIONS SYSTEM

BACKGROUND

Technical Field

The present disclosure relates to the operation of optical communications systems. More specifically, the present disclosure relates to methods of managing data flow in optical communications systems with multiple vertical cavity surface emitting lasers (VCSELs) to accommodate changes in thermal parameters and bandwidth demand for the optical communications system.

Related Art

In the art of integrated circuit (IC) technology and signal processing, optical transmission systems can transmit various forms of data at high speeds. As compared to circuitry-based architectures for transmitting signals between various nodes of a system, device, etc., optical transmission systems may rely upon light-emitting devices (e.g., photodiodes) to relay information at higher speeds than may be available through digital circuitry. One type of photodiode transmitter configured for use in an optical transmission system is "a vertical cavity surface emitting laser (VCSEL)." In this context, the term "laser" in the acronym VCSEL can refer to the diode emitter rather than the beams of light provided by the diode emitter. A typical optical transmission system may include multiple (e.g., hundreds, thousands, millions, etc.) of individual VCSELs.

FIG. 1 provides a cross-sectional view of a typical VCSEL device 10 configured for use in an optical transmission system. VCSEL device 10 may be positioned on and configured for use with a larger IC structure incorporating various types of electronic circuits. Thus, VCSEL device 10 may include a metal contact 12 positioned beneath a substrate 14 composed of one or more semiconductor materials, e.g., to provide a structural and electrical interface between metal contact 12 and the remainder of VCSEL device 10. VCSEL device 10 can also include, e.g., a lower Bragg reflector 16 and an upper Bragg reflector 18 structured to create a quantum well at the physical interface therebetween. As known in the art, a Bragg reflector refers to any type of optical reflector structured for use with optical fibers and/or other waveguides, and may include multiple layers with varying refractive index stacked in an alternating fashion (e.g., as provided through lower and upper Bragg reflectors 16, 18). Such arrangements of materials induce periodic variation in the effective refractive index of the device. An emitter contact 20 may be positioned on an upper surface of upper Bragg reflector 20, and may have a cavity 22 therein. By action of electrical principles known in the art and beyond the scope of this disclosure, transmitting an electrical current and signal to Bragg reflectors 16, 18 through metal contact 10 can cause a laser beam 24 to be emitted from cavity 22 of VCSEL device 10. Laser beam 24 can be transmitted to other components, e.g., other VCSEL devices 10 by being transmitted through a light transfer medium (not shown) such as an optical fiber or similar structure. It is understood that VCSEL device 10 may alternatively function as either a transmitter component or a receiver component in an optical communications system without regard to the underlying structure of VCSEL device 10.

Optical communications systems incorporating multiple VCSEL devices 10 may effectively send and receive large amounts of data at high speeds during the operation of various devices and/or systems. Notwithstanding the inherent advantages and features of optical communications architecture, optical communications systems which rely upon VCSEL devices 10 may have associated limitations. For instance, VCSEL devices 10 may exhibit relatively high power consumption as compared to other laser emitting devices. Underlying causes of power consumption in a VCSEL-based system can include, the impracticability of turning VCSEL devices 10 completely off due to the ensuing delays in data transmission when the device must be turned on. The need for a constant power supply to VCSEL devices 10, in turn, may contribute to heating and aging of a device with VCSEL devices 10 therein. In addition to the above-noted concerns, VCSEL-based optical communications systems may have more significant heat transfer constraints and/or higher delays between operational and non-operational states.

SUMMARY

A first aspect of the disclosure provides a method for managing data flow in an optical communications system having a plurality of vertical cavity surface emitting lasers (VCSELs), the method including: determining, during operation of the optical communications system at a first data bandwidth, whether a thermal parameter of the optical communications system violates a thermal threshold; and in response to the thermal parameter of the optical communications system violating the thermal threshold, operating the optical communications system at a second data bandwidth, wherein the operating of the optical communications system at the second data bandwidth further includes: determining whether the second data bandwidth meets a bandwidth demand on the optical communications system, in response to the second data bandwidth meeting the bandwidth demand, continuing the operating of the optical communications system at the second data bandwidth, and in response to the second data bandwidth not meeting the bandwidth demand, determining, during operation of the optical communications system at the second data bandwidth, whether the thermal parameter of the optical communications system violates the thermal threshold, and resuming the operating of the optical communications system at the first data bandwidth if the thermal parameter of the optical communications system does not violate the thermal threshold.

A second aspect of the disclosure provides a computer program product stored on a computer readable storage medium, the computer program product including program code, which, when being executed by at least one computing device, causes the at least one computing device to: determine, during operation of the optical communications system at a first data bandwidth, whether a thermal parameter of the optical communications system violates a thermal threshold; and in response to the thermal parameter of the optical communications system violating the thermal threshold, operate the optical communications system at a second data bandwidth, wherein the operation of the optical communications system at the second data bandwidth further includes: determining whether the second data bandwidth meets a bandwidth demand on the optical communications system, in response to the second data bandwidth meeting the bandwidth demand, continuing the operating of the optical communications system at the second data bandwidth, and in response to the second data bandwidth not meeting the bandwidth demand, determining, during operation of the optical communications system at the second data bandwidth, whether the thermal parameter of the optical communications system violates the thermal threshold, and resuming the operating of the optical communications system at the first data bandwidth if the thermal parameter of the optical communications system does not violate the thermal threshold.

A third aspect of the present disclosure provides a system including at least one computing device configured to perform a method for managing data flow in an optical communications system having a plurality of vertical cavity surface emitting lasers (VCSELs) by performing actions including: determining, during operation of the optical communications system at a first data bandwidth, whether a thermal parameter of the optical communications system violates a thermal threshold; and in response to the thermal parameter of the optical communications system violating the thermal threshold, operating the optical communications system at a second data bandwidth, wherein the operating of the optical communications system at the second data bandwidth further includes: determining whether the second data bandwidth meets a bandwidth demand on the optical communications system, in response to the second data bandwidth meeting the bandwidth demand, continuing the operating of the optical communications system at the second data bandwidth, and in response to the second data bandwidth not meeting the bandwidth demand, determining, during operation of the optical communications system at the second data bandwidth, whether the thermal parameter of the optical communications system violates the thermal threshold, and resuming the operating of the optical communications system at the first data bandwidth if the thermal parameter of the optical communications system does not violate the thermal threshold.

Figure 1:
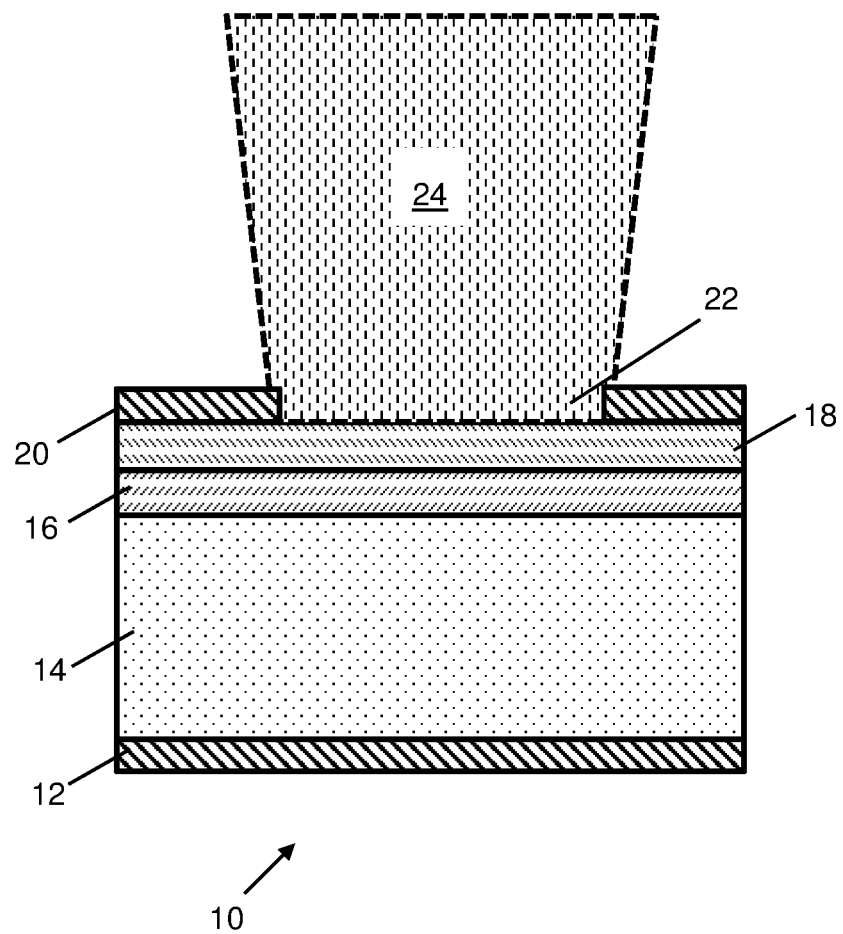
FIG. 1 provides a cross-sectional view of a conventional VCSEL device.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Introduction and General Definitions

Embodiments of the disclosure can provide operational methodologies to manage data flow in an optical communications system, as well as systems, program products, etc., for implementing such methodologies. Methods according to the disclosure can include periodically adjusting the data bandwidth of an optical communications system to account for any thermal parameters which violate a threshold value during operation. The method can also include related data flow control techniques, e.g., intentionally reducing the data bandwidth of the optical communications system during periods of reduced demand.

To better illustrate the various embodiments of the present disclosure, particular terminology which may be known or unknown to those of ordinary skill in the art is defined to further clarify the embodiments set forth herein.

The term "system" can refer to a computer system, server, etc., composed wholly or partially of hardware and/or software components, one or more instances of a system embodied in software and accessible to a local or remote user, all or part of one or more systems in a cloud computing environment, one or more physical and/or virtual machines accessed via the Internet, other types of physical or virtual computing devices, and/or components thereof. An "optical communications system" refers to a hardware infrastructure for providing telecommunication between two or more devices, entities, etc., which uses light as a medium for transmitting data. In an optical communications system, a transmitter component produces an optical signal based on particular inputs, while a receiver component interprets incoming optical signals to yield the corresponding information. The term "thermal parameter" can generally refer to any descriptive or inferential thermodynamic variable for characterizing the thermodynamic status of an optical communications system, e.g., temperature and/or entropy. The term "violate" can refer to any value of a parameter which does not comply with a predetermined rule or set of rules defining acceptable value for a parameter, e.g., being below a threshold value, being above a threshold value, being outside a range of desired values, or being within at least one range of non-desired values.

A "data bandwidth" refers to a measurement of transmission speed (e.g., bits per second) of a communications network, with higher data bandwidths indicating faster signal transmission through the network. A "bandwidth demand" refers to the current data transmission speed requested during operation of an optical communications system. A "minimum bandwidth" defines the lowest possible bandwidth for continued operation of the optical communications system, regardless of whether such a level of bandwidth will comply with the current "bandwidth demand" on the optical communications system.

Computer System and Example Components

Figure 2:
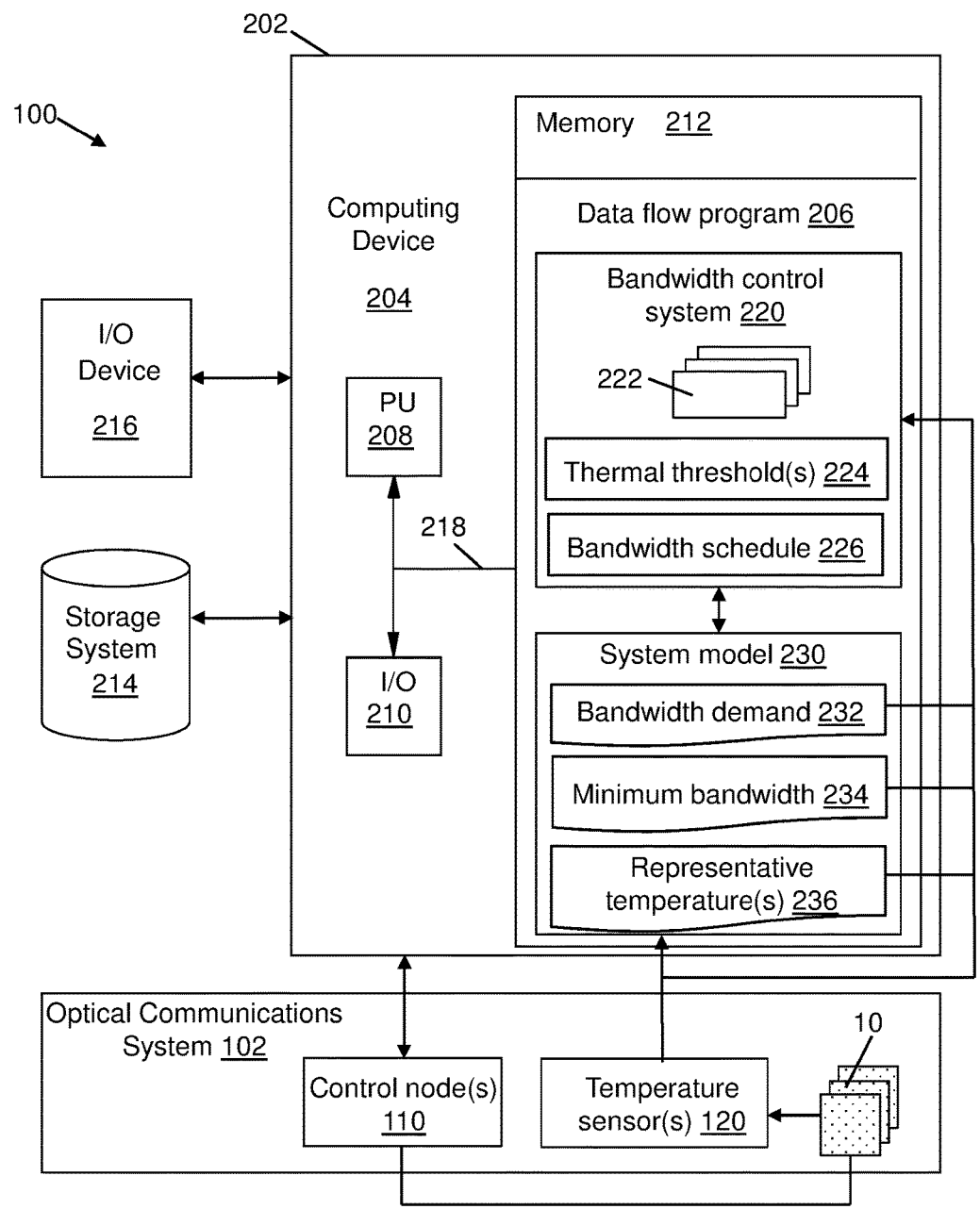
FIG. 2 depicts an illustrative environment, which includes a computer system configured to interact with an optical communications system to manage data flow according to embodiments of the disclosure.

Referring to FIG. 2, an illustrative environment 100 for implementing the methods and/or systems described herein is shown. Environment 100 can include at least one optical communications system 102 which includes multiple vertical cavity surface emitting lasers (VCSELs) embodied, e.g., as VCSEL device 10 (shown in detail in FIG. 1) or a similar VCSEL structure. VCSEL devices 10 of optical communications system 102 can each be configured to send or receive data in the form of pulsing laser lights to affect the operation of devices communicatively connected to optical communications system 102. The hardware infrastructure of optical communications system 102 can include a group of control nodes 110 (e.g., electrical interface with external components) for controlling the operation of VCSEL devices 10 based on various inputs, e.g., electrical signals, wireless signals, etc., discussed herein. Optical communications system 102 can also include one or more temperature sensors 120 for directly or indirectly measuring the temperature of optical communications system 102 during operation. Temperature sensors 120 may be used to indicate the temperature of optical communications system 102 as a whole, or may be configured to measure only targeted portions of optical communications system 102.

To manage data flow of optical communications system 102, e.g., by control and adjustment of VCSEL devices 10, environment 100 can include a computer system 202 having at least one computing device 204. Computing device 204 can include, e.g., a data flow program 206 which may include, e.g., one or more sub-systems (bandwidth control system 220 described herein) for performing any/all of the processes described herein and implementing any/all of the embodiments described herein.

Computer system 202 is shown including a processing unit (PU) 208 (e.g., one or more processors), an I/O component 210, a memory 212 (e.g., a storage hierarchy), an external storage system 214, an input/output (I/O) device 216 (e.g., one or more I/O interfaces and/or devices), and a communications pathway 218. In general, processing unit 208 can execute program code, such as data flow program 206, which is at least partially fixed in memory 212. While executing program code, processing unit 208 can process data, which can result in reading and/or writing data from/to memory 212 and/or storage system 214. Pathway 218 provides a communications link between each of the components in environment 100. I/O component 210 can comprise one or more human I/O devices, which enable a human user to interact with computer system 202 and/or one or more communications devices to enable a system user to communicate with the computer system 202 using any type of communications link. To this extent, data flow program 206 can manage a set of interfaces (e.g., graphical user interface(s), application program interface(s), etc.) that enable system users to interact with data flow program 206. Further, data flow program 206 can manage (e.g., store, retrieve, create, manipulate, organize, present, etc.) data, through several modules contained within a bandwidth control system 220 (i.e., modules 222). Bandwidth control system 220 is shown by example as being sub-systems of data flow program 206. However, it is understood that bandwidth control system 220 may be a wholly independent system. Memory 212 of computing device 204 is also shown to include a system model 230 of optical communications system 102, though it is understood that system model 230 may be included within one or more independent computing devices, programs, etc., in alternative embodiments.

As noted herein, data flow program 206 can include bandwidth control system 220. In this case, various modules 222 of bandwidth control system 220 can enable computer system 202 to perform a set of tasks used by data flow program 206, and can be separately developed and/or implemented apart from other portions of data flow program 206. Memory 212 can thus include various software modules 222 of system 220 configured to perform different actions. Example modules can include, e.g., a comparator, a calculator, a determinator, etc. One or more modules 222 can use algorithm-based calculations, look up tables, software code, and/or similar tools stored in memory 212 for processing, analyzing, and operating on data to perform their respective functions. Each module discussed herein can obtain and/or operate on data from exterior components, units, systems, etc., or from memory 212 of computing device 204.

Modules 222 of bandwidth control system 220 are shown to illustrate operation of computer system 202 according to various examples. Bandwidth control system 220 can include, e.g., modules 222 for managing data flow in optical communications system 102. Data flow program 206 can generate a system model 230 expressed, e.g., through a graphical representation, listing, and/or other organizational structure for representing various parameters of optical communications system 102. Bandwidth control system 220 can construct and/or modify various components simulated in system model 230 and various forms of data included therein. For instance, bandwidth control system 220 can quantify one or more metrics pertaining to the operation of optical communications system 102 (e.g., available bandwidth, current or past processes, temperature, bandwidth requirements for particular operations, etc.).

System model 230 can store, modify, and/or otherwise use any conceivable type of data pertaining to optical communications system 102, and particular examples are shown in FIG. 2 to better illustrate various embodiments provided herein. As shown, system model 230 can store, calculate, compare, etc., data including a bandwidth demand 232 of optical communications system 102 during a particular operation or situation. System model 230 can also include, e.g., a minimum bandwidth 234 for continued operation of optical communications system 102 for the current situation, anticipated situations, past operation, product specifications, etc. System model 230 can also include at least one representative temperature 236 for summarizing the thermal status of one or more portions of optical communications system 102. Representative temperature(s) 236 can be based at least in part on readings from temperature sensors 120 in optical communications system 102, and may be used to characterize the entire optical communications system 102 and/or only targeted portions of optical communications system 102, e.g., portions of a product where VCSEL devices 10 appear in a higher physical concentration.

According to the disclosure, data flow program 206 can produce various outputs (e.g., changes in data flow and/or continued operation of optical communications system 102) based on various features of bandwidth control system 220. Such outputs can be communicated to optical communications system 102 to control nodes 110, e.g., through I/O device 216 and/or any other solution for placing control nodes 110 in communication with data flow program 206. It is also understood that elements included within memory 212, e.g., data flow program 206, bandwidth control system 220, system model 230, etc., can include other types of parameters and/or data included therein. As an example, bandwidth control system 220 can include or be provided in the form of a data bandwidth schedule 226 including a first data bandwidth, a second data bandwidth, a series of differences between predetermined data bandwidths, etc. Data bandwidth schedule 226 can additionally or alternatively provided, e.g., in system model 230, elsewhere in memory 212, and/or through other components communicatively connected to data flow program 206.

As discussed herein, data flow program 206 can create manage data flow in optical communications system 102 to accommodate various thermal parameters, changes in bandwidth demand, etc. System model 230 can in turn include multiple layers of models, calculations, etc., each including one or more adjustable calculations, logical determinations, etc., through any currently-known or later developed analytical technique for predicting an outcome based on raw data. Data flow program 206 can accept various forms of data from system model 230 (e.g., bandwidth demand 232, minimum bandwidth 234, representative temperature 236) as inputs to affect the operation of optical communications system 102 as discussed herein. Example processes executed with data flow program 206 are discussed in detail elsewhere herein. Modules 222 of bandwidth control system 220 can implement one or more mathematical calculations and/or processes, e.g., use and/or modify various forms of data in system model 230.

Where computer system 202 comprises multiple computing devices, each computing device may have only a portion of data flow program 206, bandwidth control system 220, and/or corresponding sub-features fixed thereon (e.g., one or more modules 222, portions of system model 230, etc.). However, it is understood that computer system 202 and bandwidth control system 220 are only representative of various possible equivalent computer systems that may perform a process described herein. Computer system 202 can obtain or provide data, such as data stored in memory 212 or storage system 214, using any solution. For example, computer system 202 can generate and/or be used to generate data from one or more data stores, receive data from another system, send data to another system, etc.

Operational Methodology

Figure 3:
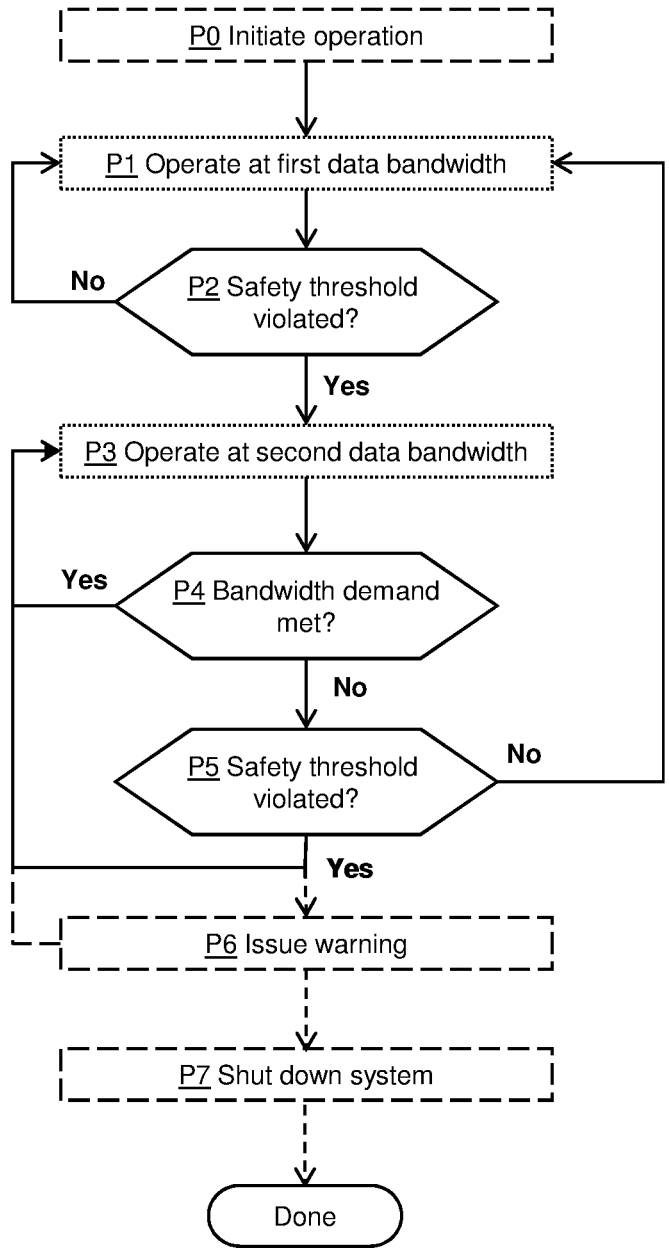
FIG. 3 is an example flow diagram of a method for managing data flow in an optical communications system according to embodiments of the disclosure.

Referring to FIGS. 2-3 together, processes for managing data flow in optical communications system 102 are discussed. The various processes depicted in FIG. 3 can be implemented, e.g., with one or more modules 222 of bandwidth control system 220, by reference to system model 230, and/or other components of computer system 202 described herein by example. In this manner, methods according to the disclosure can manage data flow in optical communications system 102 by variously adjusting the data bandwidth to accommodate changes in temperature and/or bandwidth demand. The present disclosure can be implemented with respect to one optical communications system 102 or multiple optical communications systems 102 simultaneously and/or sequentially, with each optical communications system 102 including VCSEL devices 10 in any conceivable number, etc., and that other examples are discussed herein where appropriate.

In a preliminary action designated as process P0, data flow program 206 or a user thereof can initiate operation of optical communications system 102. Initiating the operation of optical communications system 102 in process P0 can include, e.g., powering on optical communications system 102 from a powered-off or dormant state, placing data flow program 206 in communication with active optical communications system(s) 102, and/or other process which permits adjusting of optical communications system 102 according to the present disclosure. It is understood that initiating the operation of optical communications system 102 can occur with or without the use of data flow program 206 in embodiments of the present disclosure, and that process P0 to initiate operation of optical communications system 102 can proceed independently or by an independent entity relative to the other processes discussed by example herein.

The present disclosure can include, at process P1, operating optical communications system 102 at a first data bandwidth, alternatively known or identified as an "initial data bandwidth," "baseline data bandwidth," "fast data bandwidth," "default data bandwidth," etc., which may be defined in data bandwidth schedule 226. However identified, the first data bandwidth of optical communications system 102 may be a predetermined operating speed (measured, e.g., in bits per second) for accommodating a particular operating setting, e.g., peak demand, routine operation, average operating demand, etc. In the example of a networking center for an enterprise, operating optical communications system 102 at the first data bandwidth in process P1 may correspond with operation during typical business hours and days for a particular industry (e.g., weekdays between the hours of 8 AM and 5 PM).

For a variety of reasons, operating optical communications system 102 at the first data bandwidth at process P1 may occasionally cause spikes in the operating temperature and/or other thermal parameters of hardware components in optical communications system 102. As noted elsewhere herein, it may be not be preferable or technically feasible to cut power to VCSEL devices 10 when one or more VCSEL devices 10 are not in use. Although cooling systems of optical communications system 102 may alleviate such concerns, temperature may nevertheless occasionally rise above a desired thermal limit for optical communications system 102 and/or its site of implementation. To further address these situations, embodiments of the disclosure can include determining in process P2 whether one or more thermal parameters of optical communications system 102 violate thermal threshold(s) 224. Modules 222 of bandwidth control system 220 can determine in process P2 whether thermal threshold(s) 224 have been violated, e.g., by comparing temperature readings from temperature sensor(s) 120 with predetermined threshold temperatures defined as thermal thresholds 224 in memory 212. In alternative embodiments, modules 222 of bandwidth control system 220 can compare one or more representative temperature(s) 236 or other thermal parameters provided in system model 230 with corresponding threshold values for such parameters, defined as thermal threshold(s) 224 in memory 212. It is also understood that the determining in process P2 can include simultaneously comparing measurements by temperature sensor(s) 120 and inferential parameters of system model 230 with corresponding thermal threshold(s) 224.

Determining whether thermal parameters violate thermal threshold(s) 224 in process P2 can cause differences in continued operation to maintain satisfactory operation of optical communications system 102. Specifically, the present disclosure can include actions for reducing thermal parameters of optical communications system 102 when they violate predetermined thermal thresholds 224. Various implementations for determining whether thermal parameters of optical communications system 102 violate thermal threshold(s) 224 are discussed elsewhere herein relative to FIG. 5. Where modules 222 of bandwidth control system 220 determine that the thermal parameter(s) under analysis do not violate thermal threshold(s) 224 (i.e., "No" at process P2), processing can continue by returning to process P1 and continuing to operate optical communications system 102 at the first data bandwidth. Thereafter, bandwidth control system can return to process P2 and again determine after a predetermined time (e.g., several seconds, minutes, hours, etc.) whether thermal parameters of optical communications system 102 violate thermal threshold 224. In the case that thermal parameter(s) under analysis violate the thermal threshold (i.e., "Yes" at process P2), the flow can proceed to process P3 of operating optical communications system 102 at a second data bandwidth with a different bandwidth from the first data bandwidth. In some cases, the second data bandwidth may be lower than the first data bandwidth or vice versa. Using the case of the second data bandwidth being lower than the first data bandwidth as an example, the second data bandwidth may alternatively be identified in relative terms as a "reduced data bandwidth," "recovery data bandwidth," "slow data bandwidth," "alternative data bandwidth," "adjusted data bandwidth," etc., and in any case may be defined within data bandwidth schedule 226.

According to an embodiment, operating optical communications system 102 at the second data bandwidth in process P3 can include operating optical communications system 102 at a data bandwidth that is less than the first data bandwidth of process P1. According to one example, the second data bandwidth of process P3 can include a data bandwidth of, e.g., any bandwidth in (bits per second) greater than zero percent of the first data bandwidth and less than one-hundred percent of the first data bandwidth. The second data bandwidth of process P3 can alternatively be defined as any data bandwidth different from the first data bandwidth which causes a reduction in the thermal parameter(s) of optical communications system 102 used for the determination at process P2. To adjust the data bandwidth of optical communications system 102 in process P3, the disclosure can include adjusting control node(s) 110 of optical communications system 102 with modules 222 of bandwidth control system 220, and thereby cause optical communications system 102 to continue operating at the second data bandwidth.

Further operations of optical communications system 102 and data flow program 206 can include continuing to operate optical communications system 102 at the second data bandwidth while providing further analysis and adjustment. As noted herein, operating optical communications system 102 at the second data bandwidth can help to reduce the thermal parameter(s) analyzed in process P2 to determine whether thermal threshold 242 is violated. For example, reducing the data bandwidth of optical communications system 102 can reduce the amount of power drawn by VCSEL devices 10 and their associated thermal output, thereby reducing the temperature of optical communications system 102. Notwithstanding these improvements to thermal stability during operation at the second data bandwidth, operational demand and/or other circumstances may cause the second data bandwidth to be less than the current bandwidth demand on optical communications system 102.

To account for shortfalls in bandwidth, the flow can proceed to process P4 of determining whether continued operation of optical communications system 102 meets an identified amount of bandwidth demand (e.g., bandwidth demand 232 in system model 230) on optical communications system 102. Modules 222 of bandwidth control system 220 thus may mathematically determine, e.g., based on direct comparison and/or computation, whether continued operation of optical communications system 102 meets the bandwidth (e.g., bits per second) desired for current system operations. In the event that continued operation of optical communications system 102 at the second data bandwidth meets bandwidth demand 232, the flow can return to process P3 of continuing to operate optical communications system 102 at the second data bandwidth for a predetermined amount of time (e.g., a span of seconds, minutes, hours, etc.), before returning to process P4. Thus, embodiments of the disclosure can provide continued operation of optical communications system 102 at the second data bandwidth even after thermal parameters drop below thermal threshold 224, e.g., to reduce the risk of violating thermal threshold 224 when operation at a lower bandwidth is possible.

Although operating at the second data bandwidth in process P3 can aid in keeping thermal parameters of optical communications system 102 below thermal threshold 224, the bandwidth demand on optical communications system 102 may specify a data bandwidth greater than the second data bandwidth defined, e.g., in data bandwidth schedule 226. Where modules 222 of bandwidth control system 220 determine that bandwidth demand 232 is not met (i.e., "No" at process P4), the process flow can continue to process P5 of again determining whether thermal threshold 224 is violated. In contrast to the determining in process P2 during operation at the first data bandwidth, the determining in process P5 can occur during operation of optical communications system 102 at the second data bandwidth. In cases where the thermal parameter(s), e.g., temperature, of optical communications system 102 have returned to below the thermal threshold (i.e., "No" at process P5), the method can return to process P1 discussed herein. More specifically, modules 222 of bandwidth control system 220 can adjust control node(s) 110 of optical communications system 102 to resume operation at the first data bandwidth defined in data bandwidth schedule 226, due to the thermal parameter(s) of optical communications system 102 not violating thermal threshold 224.

In situations where the thermal parameter(s) of optical communications system 102 violate thermal threshold 224 despite continued operation at the second data bandwidth (i.e., "Yes" at process P5) optical communications system 102 can continue to operate at the second data bandwidth. The disclosure can additionally or alternatively account any continued operation above thermal threshold 224. At process P6, one or more modules 222 of bandwidth control system 220 can optionally issue a warning to user(s) of data flow program 206 (e.g., operators of computer system 202 through I/O device 216) that the analyzed thermal parameter(s) of optical communications system 102 continue to violate thermal threshold 224. The range of processing effects and/or technical consequences of violating thermal threshold 224 during operation at the second data bandwidth may vary between optical communications systems 102, implementation settings, industries, etc. In some cases, e.g., where operation at the second data bandwidth will eventually return the thermal parameter(s) to below thermal threshold 224, the present disclosure can include continuing to operate optical communications system 102 at the second data bandwidth (e.g., at process P3) for a predetermined time before repeating the determination of processes P4, P5.

In other situations which may pose a significant operational risk, e.g., implementations with higher thermal sensitivity, repeated "Yes" determinations at process P5, etc., the method can optionally include continuing to process P7 in which data flow program 206 shuts down further operation of optical communications system 102, e.g., by adjusting control modes 110 to cease all further operation. It is further understood that processes P6 and P7 may be implemented as a single response to a "Yes" determination at process P5, e.g., such that shutting down optical communications system 102 coincides with issuing the warning that thermal threshold 224 is violated. The flow may then conclude ("Done") to permit a user, technician, system, etc., to service optical communications system 102 and/or otherwise compensate for past operation above thermal threshold 224.

Figure 4:
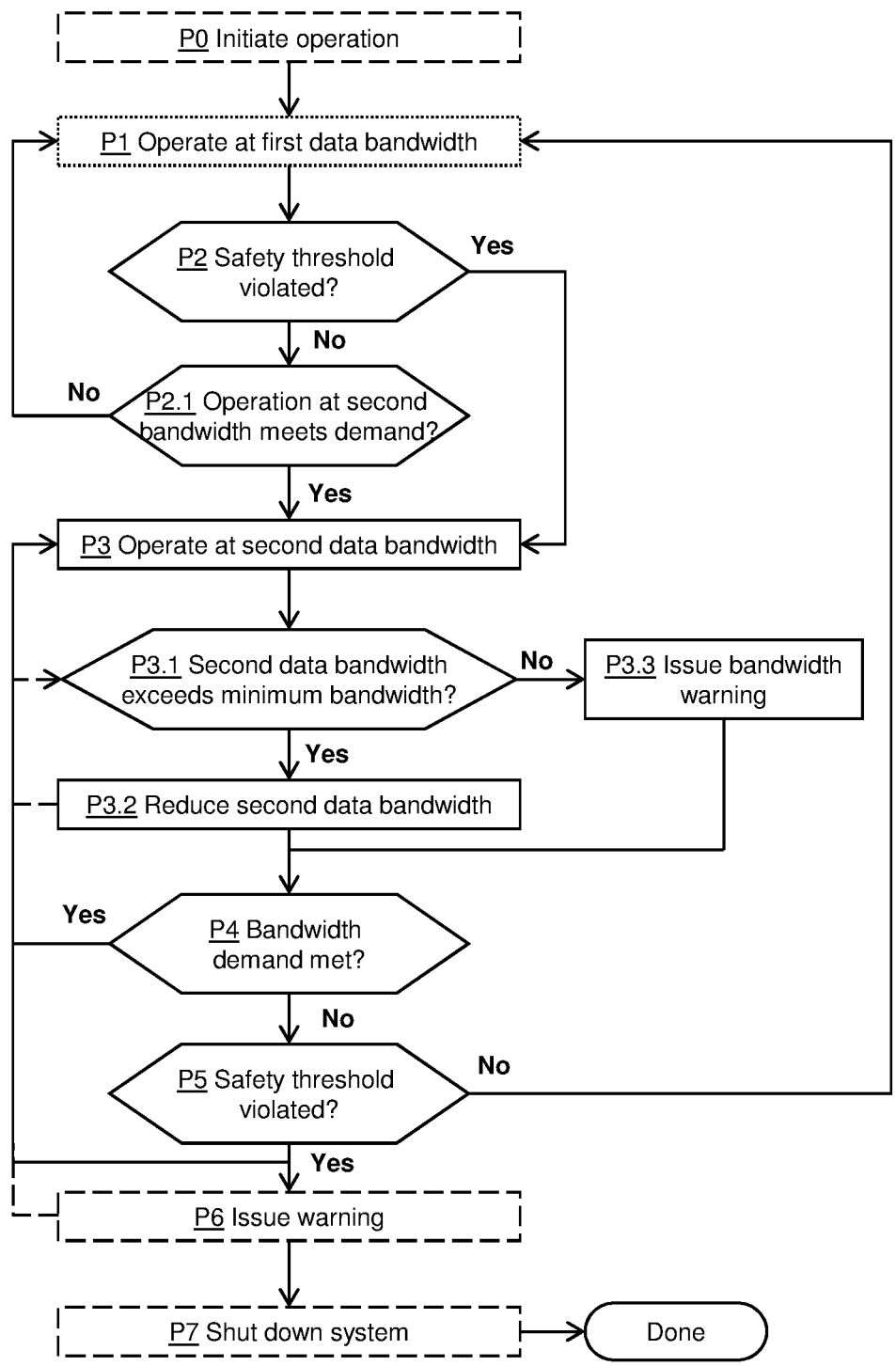
FIG. 4 is an example flow diagram of a method for managing data flow in an optical communications system according to further embodiments of the disclosure.

Referring now to FIGS. 2 and 4 together, further embodiments of the disclosure can include one or more optional processes for further managing data flow in optical communications system 102, e.g., to permit further reduction in data bandwidth(s) defined in data bandwidth schedule 226, or to accommodate periods of low demand. As shown in FIG. 4, embodiments of the disclosure can include an additional process P2.1 included to allow operation at a reduced data bandwidth even when thermal threshold 224 is not violated. Where continued operation of optical communications system 102 at the first data bandwidth does not violate thermal threshold 224 (i.e., "No" at process P2), the method can alternatively continue to process P2.1 in which modules 222 of bandwidth control system 220 determine whether operating optical communications system 102 at the second data bandwidth would meet bandwidth demand 232. The determination in process P2.1 can include, e.g., comparing the second data bandwidth (defined, e.g., in bits per second and defined in data bandwidth schedule 226) with the current bandwidth demand on optical communications system 102.

Where operation of optical communications system 102 at the second bandwidth demand would not meet bandwidth demand 232 (i.e., "No" at process P2.1) data flow program 206 can return to process P1 and resume operating optical communications system 102 at the first data bandwidth. Such operation can continue for a predetermined time (e.g., a preset number of seconds, minutes, hours, etc.) before repeating the determination(s) of process(es) P2 and/or P2.1. In cases where operation of optical communications system 102 at the second data bandwidth would meet bandwidth demand 232 (i.e., "Yes" at process P2.1), the flow can proceed to process P3 of operating optical communications system 102 at the second data bandwidth. In this case, adjusting the data bandwidth of optical communications system 102 can include adjusting control node(s) 110 to provide the reduced data bandwidth as discussed elsewhere herein relative to processes P2, P3 shown in FIG. 3. The amount of bandwidth reduction applied to the second demand bandwidth can also be defined, e.g., in data bandwidth schedule 226. Incorporating process P2.1 into the process flow shown herein can thus permit reductions in operating bandwidth and/or reduced risk of violating thermal threshold 224 even when thermal threshold 224 is not violated.

The example process flow of FIG. 4 also includes further substitutions and/or optional processes for accommodating varied bandwidth demands. It is conceivable, e.g., that continued operation at the second data bandwidth may not reduce the thermal parameter(s) of optical communications system 102 below thermal threshold 224. In other instances, the time required to reduce thermal parameter(s) of optical communications system 102 below thermal threshold 224 during operation at the second data bandwidth may be less than a desired transition time. When optical communications system 102 operates at the second data bandwidth, further processes P3.1, P3.2, P3.3 may reduce the second data bandwidth to even lower levels. According to an example, processes according to the disclosure can include, after operating optical communications system 102 at the second data bandwidth in process P3, determining whether the current data bandwidth exceeds minimum bandwidth 234 at process P3.1. So long as the second data bandwidth is initially set to comply with minimum operating requirements for optical communications system 102, initial operation of optical communications system 102 at the second data bandwidth will at least meet or exceed minimum bandwidth 234. Where the second data bandwidth exceeds minimum bandwidth 234 (i.e., "Yes" at process P3.1), the flow can continue to process P3.2 of reducing the second data bandwidth to a lower amount (e.g., a reduced number of bits per second). The amount of reduction in process P3.2 may be user-defined, and/or may be included in bandwidth schedule 226 as a set of predetermined increments. For instance, a set of incrementally larger or smaller reductions in bandwidth may be used in process P3.2 to accommodate different needs or constraints. In any case, reducing the amount of the second data bandwidth can further reduce the analyzed thermal parameters of optical communications system 102. As shown, the flow can optionally return to process P3.1 to permit further reduction in the second data bandwidth to compensate for cases where the thermal parameter(s) violate thermal threshold 224 by large amounts. In other situations, the flow can proceed from process P3.2 to process P4 of determining whether the current value of the second data bandwidth meets bandwidth demand 232, after the reducing in process P3.2.

In some cases, the reduced data bandwidths contemplated herein may fail to comply with minimum bandwidth 234, e.g., as a result of repeated reductions to the second data bandwidth. The present disclosure can include further processing to avoid violating the minimum constraints of optical communications system 102. Where the second data bandwidth fails to exceed minimum bandwidth 234, e.g., after multiple reductions in process P3.2 (i.e., "No" at process P3.1), the flow can instead proceed to other processes. In process P3.3, modules 222 of bandwidth control system 220 can issue a bandwidth warning to users of data flow program 206 that the reduced value of second data bandwidth fails to exceed minimum bandwidth 234. In addition to notifying a user, the bandwidth warning of process P3.3 can also include, e.g., an automatic reversion to the original second data bandwidth of data bandwidth schedule 226, or automatic increase to the most recent operation bandwidth above minimum bandwidth 234. The method can then proceed to process P4 without reducing the second data bandwidth in process P3.2, and continue assessing whether the non-reduced second data bandwidth complies with bandwidth demand 232 in process P4, and/or thermal threshold 224 in process P5. Although processes P2.1, P3.1, P3.2, P3.3 are illustrated together in FIG. 4, it is understood that these various additional and/or alternative steps may be implemented together or separately to accommodate user preference and/or different needs for optical communications system 102.

Figure 5:
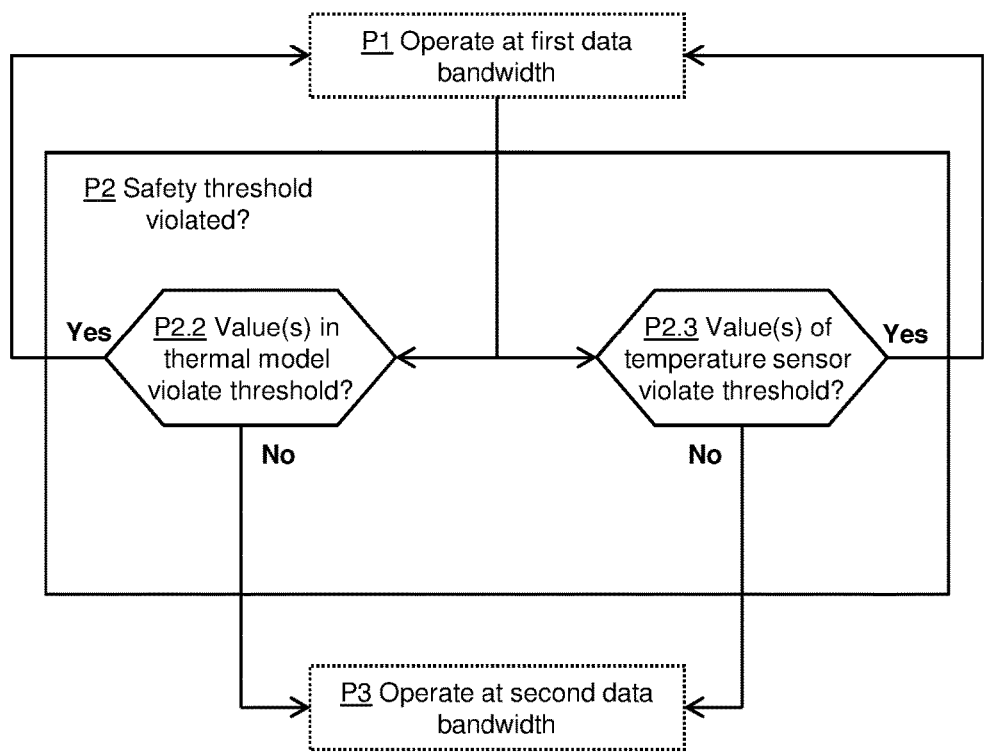
FIG. 5 is an example flow diagram of a method for determining whether a thermal threshold is violated according to further embodiments of the disclosure.

Referring now to FIGS. 2, 3, and 5 together, embodiments of the disclosure can include various methodologies for determining whether thermal parameter(s) of optical communications system 102 violate thermal threshold(s) 224 in process P2. According to an embodiment, the determining in process P2 can include sub-process P2.2 and/or sub-process P2.3 for comparing different values to thermal threshold 224. Although sub-processes P2.2, P2.3 are shown by example in FIG. 5 as having a parallel ordering, the processes P2.2 and/or P2.3 may be omitted and/or implemented sequentially to accommodate varying needs or user preferences. At process P2.2, modules 222 of bandwidth control program 220 can compare representative temperature(s) 236 of system model 230 with thermal threshold 224 to evaluate whether to continue operating at the first data bandwidth. As noted elsewhere herein, representative temperature(s) 236 may be derived from one or more temperature sensor(s) 120 of optical communications system 102, or other properties of optical communications system 102. In cases where process P2 includes sub-process P2.2, representative temperature(s) 236 violating thermal threshold 224 (i.e., "No" at process P2.2) can cause the flow to return to process P1 of continuing to operate optical communications system 102 at the first data bandwidth. By contrast, where representative temperature(s) 236 violate thermal threshold 224 (i.e., "Yes" at process P2.2), the flow can then proceed to process P3 of operating optical communications system 102 at the second data bandwidth as discussed elsewhere herein.

A similar process flow can apply to process P2.3. By contrast to other sub-processes of process P2, process P2.3 can include determining whether temperature values in temperature sensor(s) 120 violate thermal threshold 224. In cases where process P2 includes sub-process P2.3, temperature readings of optical communication system 102 from temperature sensor(s) 120 violating thermal threshold 224 (i.e., "No" at process P2.3) can cause the flow to return to process P1 of continuing to operate optical communications system 102 at the first data bandwidth. Where the sensed temperature(s) violate thermal threshold 224 (i.e., "Yes" at process P2.3), the flow can then proceed to process P3 of operating optical communications system 102 at the second data bandwidth as discussed elsewhere herein. It is also understood, e.g., that proceeding to process P3 may be contingent upon a lack of any thermal parameters violating thermal threshold 224 (i.e., "No" at process P2.2 and at process P2.3). Where processes P2.2, P2.3 are implemented in parallel with each other a user can determine whether conflicting determinations, e.g., "Yes" at process P2.2 but "No" at process P2.3, will cause the process flow to continue to process P3 (operate at second data bandwidth) or return to process P1 (operate at first data bandwidth). In one example implementation, conflicting determinations at process P2.2 and process P2.3 with at least one "Yes" determination will automatically cause data flow program 206 to initiate operation at the second data bandwidth in process P3.

Although the various sub-processes discussed herein are applied to process P2 by way of example, it is understood that these sub-processes can also be implemented with respect to any other operation for determining whether thermal parameters of optical communications system 102 violate thermal threshold 224, e.g., process P5 (FIGS. 3-4), without any changes to the implementation of sub-processes P2.2, P2.3 or with minor changes to accommodate differences in the setting of operation (e.g., substituting process P5 and/or P6 for process P3).

Alternative Embodiments and Implementations

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the present disclosure may take the form of a computer program product embodied in one or more computer readable medium(s) having computer readable program code embodied thereon.

Any combination of one or more computer readable medium(s) may be used. A computer readable storage medium may be, for example, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the Figures illustrate the layout, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As used herein, the term "configured," "configured to" and/or "configured for" can refer to specific-purpose patterns of the component so described. For example, a system or device configured to perform a function can include a computer system or computing device programmed or otherwise modified to perform that specific function. In other cases, program code stored on a computer-readable medium (e.g., storage medium), can be configured to cause at least one computing device to perform functions when that program code is executed on that computing device. In these cases, the arrangement of the program code triggers specific functions in the computing device upon execution. In other examples, a device configured to interact with and/or act upon other components can be specifically shaped and/or designed to effectively interact with and/or act upon those components. In some such circumstances, the device is configured to interact with another component because at least a portion of its shape complements at least a portion of the shape of that other component. In some circumstances, at least a portion of the device is sized to interact with at least a portion of that other component. The physical relationship (e.g., complementary, size-coincident, etc.) between the device and the other component can aid in performing a function, for example, displacement of one or more of the device or other component, engagement of one or more of the device or other component, etc.

The descriptions of the various embodiments of the present disclosure have been presented for purposes of illustration, but are not intended to be exhaustive or lit ited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for managing data flow in an optical communications system having a plurality of vertical cavity surface emitting lasers (VCSELs), the method comprising: determining, during operation of the optical communications system at a first data bandwidth, whether a thermal parameter of the optical communications system violates a thermal threshold; and in response to the thermal parameter of the optical communications system violating the thermal threshold, operating the optical communications system at a second data bandwidth, wherein the operating of the optical communications system at the second data bandwidth further includes: determining whether the second data bandwidth meets a bandwidth demand on the optical communications system, in response to the second data bandwidth meeting the bandwidth demand, continuing the operating of the optical communications system at the second data bandwidth, in response to the second data bandwidth not meeting the bandwidth demand, determining, during operation of the optical communications system at the second data bandwidth, whether the thermal parameter of the optical communications system violates the thermal threshold, and resuming the operating of the optical communications system at the first data bandwidth if the thermal parameter of the optical communications system does not violate the thermal threshold, in response to the thermal parameter of the optical communications system violating the thermal threshold, determining whether the second data bandwidth violates a minimum bandwidth for the optical communications system, in response to the second data bandwidth exceeding the minimum bandwidth for the optical communications system, reducing the second data bandwidth before continuing the operating of the optical communications system at the second data bandwidth, and in response to the second data bandwidth not exceeding the minimum bandwidth for the optical communications system, issuing a warning responsive to the minimum bandwidth of the optical communications system is not exceeded.

2. The method of claim 1, wherein operating the optical communications system at the first data bandwidth further includes: in response to the thermal parameter of the optical communications system not violating the thermal threshold during operation at the first data bandwidth, determining whether operation at the second data bandwidth meets the bandwidth demand on the optical communications system; in response to determining that the second data bandwidth does not meet the bandwidth demand on the optical communications system, continuing the operating of the optical communications system at the first data bandwidth; and in response to determining that the second data bandwidth meets the bandwidth demand on the optical communications system, operating of the optical communications system at the second data bandwidth.

3. The method of claim 1, wherein operating the optical communications system at the first data bandwidth further includes: in response to the thermal parameter of the optical communications system violating the thermal threshold, reducing the second data bandwidth before continuing the operating of the optical communications system at the second data bandwidth.

4. The method of claim 1, wherein determining whether the thermal parameter of the optical communications system violates the thermal threshold includes comparing at least one measured temperature of the optical communications system with the thermal threshold.

5. The method of claim 1, wherein determining whether the thermal parameter of the optical communications system violates the thermal threshold includes comparing a representative temperature from a model of the optical communications system with the thermal threshold.

6. The method of claim 1, wherein the optical communications system includes at least one transmitter VCSEL and at least one receiver, and wherein operating the optical communications system at the first data bandwidth and the second data bandwidth simultaneously affects a data flow rate of the at least one transmitter VCSEL and a data flow rate of the at least one receiver.

7. The method of claim 1, further comprising, in response to the thermal parameter of the optical communications system violating the thermal threshold during operation at the second data bandwidth, performing actions including issuing a warning if the thermal threshold of the optical communications system is violated, wherein issuing the warning to indicate the thermal threshold of the optical communications system is violated includes shutting down the optical communications system.

8. A computer program product stored on a non-transitory computer readable medium, the computer program product comprising program code, which, when being executed by at least one computing device, causes the at least one computing device to: determine, during operation of the optical communications system at a first data bandwidth, whether a thermal parameter of the optical communications system violates a thermal threshold; and in response to the thermal parameter of the optical communications system violating the thermal threshold, operate the optical communications system at a second data bandwidth, wherein the operation of the optical communications system at the second data bandwidth further includes: determining whether the second data bandwidth meets a bandwidth demand on the optical communications system, in response to the second data bandwidth meeting the bandwidth demand, continuing the operating of the optical communications system at the second data bandwidth, in response to the second data bandwidth not meeting the bandwidth demand, determining, during operation of the optical communications system at the second data bandwidth, whether the thermal parameter of the optical communications system violates the thermal threshold, and resuming the operating of the optical communications system at the first data bandwidth if the thermal parameter of the optical communications system does not violate the thermal threshold, in response to the thermal parameter of the optical communications system violating the thermal threshold, determining whether the second data bandwidth exceeds a minimum bandwidth for the optical communications system, in response to the second data bandwidth exceeding the minimum bandwidth for the optical communications system, reducing the second data bandwidth before continuing the operating of the optical communications system at the second data bandwidth, and in response to the second data bandwidth not exceeding the minimum bandwidth for the optical communications system, issuing a warning to indicate the minimum bandwidth of the optical communications system is not exceeded.

9. The computer program product of claim 8, wherein operating the optical communications system at the first data bandwidth further causes the at least one computing device to: in response to the thermal parameter of the optical communications system not violating the thermal threshold during operation at the second data bandwidth, determine whether operation at the second data bandwidth meets the bandwidth demand on the optical communications system; in response to determining that the second data bandwidth does not meet the bandwidth demand on the optical communications system, continue the operating of the optical communications system at the first data bandwidth; and in response to determining that the second data bandwidth meets the bandwidth demand on the optical communications system, operate the optical communications system at the second data bandwidth.

10. The computer program product of claim 8, wherein operating the optical communications system at the second data bandwidth further causes the at least one computing device to issue a warning if the thermal threshold of the optical communications system is violated, wherein issuing the warning to indicate the thermal threshold of the optical communications system is violated includes shutting down the optical communications system.

11. The computer program product of claim 8, wherein determining whether the thermal parameter of the optical communications system violates the thermal threshold includes comparing at least one measured temperature of the optical communications system with the thermal threshold.

12. The computer program product of claim 8, wherein determining whether the thermal parameter of the optical communications system violates the thermal threshold includes comparing a representative temperature from a model of the optical communications system with the thermal threshold.

13. The computer program product of claim 8, wherein the optical communications system includes at least one transmitter VCSEL and at least one receiver, and wherein operating the optical communications system at the first data bandwidth and the second data bandwidth simultaneously affects a data flow rate of the at least one transmitter VCSEL and a data flow rate the at least one receiver.

14. A system comprising at least one computing device configured to perform a method for managing data flow in an optical communications system having a plurality of vertical cavity surface emitting lasers (VCSELs) by performing actions including: determining, during operation of the optical communications system at a first data bandwidth, whether a thermal parameter of the optical communications system violates a thermal threshold; and in response to the thermal parameter of the optical communications system violating the thermal threshold, operating the optical communications system at a second data bandwidth, wherein the operating of the optical communications system at the second data bandwidth further includes: determining whether the second data bandwidth meets a bandwidth demand on the optical communications system, in response to the second data bandwidth meeting the bandwidth demand, continuing the operating of the optical communications system at the second data bandwidth, in response to the second data bandwidth not meeting the bandwidth demand, determining, during operation of the optical communications system at the second data bandwidth, whether the thermal parameter of the optical communications system violates the thermal threshold, and resuming the operating of the optical communications system at the first data bandwidth if the thermal parameter of the optical communications system does not violate the thermal threshold, in response to the thermal parameter of the optical communications system violating the thermal threshold, determining whether the second data bandwidth exceeds a minimum bandwidth for the optical communications system, in response to the second data bandwidth exceeding the minimum bandwidth for the optical communications system, reducing the second data bandwidth before continuing the operating of the optical communications system at the second data bandwidth, and in response to the second data bandwidth not exceeding the minimum bandwidth for the optical communications system, issuing a warning to indicate the minimum bandwidth of the optical communications system is not exceeded.

15. The system of claim 14, wherein operating the optical communications system at the first data bandwidth further includes: in response to the thermal parameter of the optical communications system not violating the thermal threshold during operation at the second data bandwidth, determining whether operation at the second data bandwidth meets the bandwidth demand on the optical communications system; in response to determining that the second data bandwidth does not meet the bandwidth demand on the optical communications system, continuing the operating of the optical communications system at the first data bandwidth; and in response to determining that the second data bandwidth meets the bandwidth demand on the optical communications system, operating of the optical communications system at the second data bandwidth.

16. The system of claim 14, wherein operating the optical communications system at the second data bandwidth further includes: in response to the thermal parameter of the optical communications system violating the thermal threshold during operation at the second data bandwidth, performing actions including issuing a warning if the thermal threshold of the optical communications system is violated, wherein issuing the warning to indicate the thermal threshold of the optical communications system is violated includes shutting down the optical communications system.

17. The system of claim 14, wherein the optical communications system includes at least one transmitter VCSEL and at least one receiver, and wherein operating the optical communications system at the first data bandwidth and the second data bandwidth simultaneously affects a data flow rate of the at least one transmitter VCSEL and a data flow rate of the at least one receiver.

* * * * *